US012785651B2

(12) United States Patent
Nishimura

(10) Patent No.: US 12,785,651 B2
(45) Date of Patent: Nov. 3, 2026

(54) RESONATOR

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 657 days.

(21) Appl. No.: 18/454,954

(22) Filed: Aug. 24, 2023

(65) Prior Publication Data

US 2023/0402991 A1 Dec. 14, 2023

Related U.S. Application Data

(63) Continuation of application No. PCT/JP2021/039760, filed on Oct. 28, 2021.

(30) Foreign Application Priority Data

Apr. 20, 2021 (JP) ................................ 2021-071400

(51) Int. Cl.
*H03H 9/02* (2006.01)
*H03H 9/145* (2006.01)
*H03H 9/25* (2006.01)

(52) U.S. Cl.
CPC .... *H03H 9/02574* (2013.01); *H03H 9/02551* (2013.01); *H03H 9/02834* (2013.01); *H03H 9/14544* (2013.01); *H03H 9/25* (2013.01)

(58) Field of Classification Search
CPC .. H03H 9/02551; H03H 9/14544; H03H 9/25; H03H 9/02559; H03H 9/02574
See application file for complete search history.

(56) References Cited

U.S. PATENT DOCUMENTS 9,190,981 B2 * 11/2015 Kando ............... H03H 9/02574
10,084,427 B2 * 9/2018 Solal .................. H03H 9/02551
10,454,447 B2 * 10/2019 Solal ........................ H03H 3/08
(Continued)

FOREIGN PATENT DOCUMENTS

JP 2005065160 A 3/2005
JP 2006191330 A 7/2006
(Continued)

OTHER PUBLICATIONS

International Search Report in PCT/JP2021/039760, mailed Jan. 18, 2022, 3 pages.

*Primary Examiner* — Pedro J Cuevas
(74) *Attorney, Agent, or Firm* — ArentFox Schiff LLP

(57) ABSTRACT

A resonator is provided that includes a piezoelectric layer having a first and second surfaces that oppose each other, an IDT electrode on the first surface of the piezoelectric layer, and a high acoustic velocity substrate on the second surface of the piezoelectric layer. The piezoelectric layer is made from a quartz crystal having cut-angles obtained by rotating a plane orthogonal to a crystal Y-axis about a crystal X-axis, in a propagation direction at 90°±10° to the crystal X-axis of the piezoelectric layer, an acoustic velocity in the high acoustic velocity substrate is higher than an acoustic velocity in the piezoelectric layer, and the IDT electrode includes a comb-shaped electrode including multiple electrode fingers aligned in the propagation direction.

20 Claims, 22 Drawing Sheets

(56) References Cited

U.S. PATENT DOCUMENTS

| | | | | | |
|---|---|---|---|---|---|
| 11,824,518 | B2 * | 11/2023 | Takigawa | H03H 9/1457 |
| 11,838,006 | B2 * | 12/2023 | Michigami | H03H 9/13 |
| 12,009,799 | B2 * | 6/2024 | Iwamoto | H03H 9/02228 |
| 12,567,853 | B2 * | 3/2026 | Taguchi | H03H 9/02574 |
| 2005/0062560 | A1 | 3/2005 | Oshio | |
| 2006/0145568 | A1 | 7/2006 | Morita et al. | |
| 2006/0145569 | A1 | 7/2006 | Morita et al. | |
| 2013/0285768 | A1 | 10/2013 | Watanabe et al. | |
| 2014/0203893 | A1 * | 7/2014 | Kando | H03H 9/02574 333/187 |
| 2017/0222622 | A1 * | 8/2017 | Solal | H03H 9/02574 |
| 2018/0337654 | A1 * | 11/2018 | Solal | H03H 3/007 |
| 2019/0267966 | A1 | 8/2019 | Hiratsuka et al. | |
| 2020/0328728 | A1 * | 10/2020 | Nakagawa | H04B 1/0057 |
| 2020/0328823 | A1 | 10/2020 | Nakagawa et al. | |
| 2021/0305964 | A1 | 9/2021 | Kimura et al. | |
| 2022/0123731 | A1 * | 4/2022 | Iwamoto | H03H 9/02574 |
| 2022/0131517 | A1 * | 4/2022 | Iwamoto | H03H 9/6483 |
| 2023/0402991 | A1 * | 12/2023 | Nishimura | H03H 9/25 |
| 2023/0412143 | A1 * | 12/2023 | Taguchi | H03H 9/02574 |
| 2024/0007081 | A1 * | 1/2024 | Iwamoto | H03H 9/1452 |
| 2024/0275354 | A1 * | 8/2024 | Daimon | H03H 9/02637 |

FOREIGN PATENT DOCUMENTS

| | | | |
|---|---|---|---|
| JP | 2006203408 | A | 8/2006 |
| JP | 5910763 | B2 | 4/2016 |
| JP | 2019149724 | A | 9/2019 |
| WO | 2019138812 | A1 | 7/2019 |
| WO | 2020121976 | A1 | 6/2020 |

* cited by examiner

RESONATOR

CROSS REFERENCE TO RELATED APPLICATIONS

This application is a continuation of International Application No. PCT/JP2021/039760, filed Oct. 28, 2021, which claims priority to Japanese Patent Application No. 2021-071400, filed Apr. 20, 2021, the entire contents of each of which are hereby incorporated by reference in their entirety.

TECHNICAL FIELD

The present invention relates to a resonator.

BACKGROUND

Surface acoustic wave (hereinafter referred to as "SAW") resonators are known as acoustic wave devices used in resonators, band-pass filters, and the like. Evolution of mobile communication systems, such as mobile phones, requires improvements in various characteristics such as Q factors and frequency temperature characteristics of SAW resonators.

For example, Japanese Unexamined Patent Application Publication No. 2006-203408 (hereinafter "Patent Document 1") discloses a surface acoustic wave device including a piezoelectric substrate and an IDT provided on the piezoelectric substrate, in which an excitation wave is an SH wave. In this surface acoustic wave device, grooves are formed in spaces between electrode fingers of the IDT to improve a Q factor.

Moreover, Japanese Patent No. 5910763 (hereinafter "Patent Document 2") discloses an acoustic wave device including a high acoustic velocity support substrate, a piezoelectric film, and an IDT electrode. In this acoustic wave device, a low acoustic velocity film having a thickness in a range of 0.1λ to 0.5λ is provided between the high acoustic velocity support substrate and the piezoelectric film to improve a Q factor, where λ is a wavelength of an acoustic wave determined by an electrode period of the IDT electrode.

Yet further, Japanese Unexamined Patent Application Publication No. 2019-149724 (hereinafter "Patent Document 3") discloses a surface acoustic wave device in which a quartz crystal layer, an amorphous silicon oxide layer, a piezoelectric layer, and a comb-shaped electrode are stacked in this order. In this surface acoustic wave device, a thickness of the amorphous silicon oxide layer and a thickness of the piezoelectric layer are set to appropriate values to improve frequency temperature characteristics and other characteristics.

However, in the surface acoustic wave device described in Patent Document 1, it is difficult to control a depth of the grooves in the spaces between the electrode fingers, so it is not always possible to improve the Q factor sufficiently.

Moreover, in the acoustic wave device described in Patent Document 2 and the surface acoustic wave device described in Patent Document 3, a first-order temperature coefficient of frequency is improved, but there is room for further improvement in the frequency temperature characteristics.

SUMMARY OF THE INVENTION

Accordingly, it is an object of the present invention to provide a resonator having excellent frequency temperature characteristics and/or resonance characteristics.

In an exemplary aspect, a resonator is provided that includes a piezoelectric layer having first and second surfaces that oppose each other, an IDT electrode on the first surface of the piezoelectric layer, and a high acoustic velocity substrate on the second surface of the piezoelectric layer. In this aspect, the piezoelectric layer is made from a quartz crystal having cut-angles obtained by rotating a plane orthogonal to a crystal Y-axis about a crystal X-axis, in a propagation direction at 90°±10° to the crystal X-axis of the piezoelectric layer, an acoustic velocity in the high acoustic velocity substrate is higher than an acoustic velocity in the piezoelectric layer, and the IDT electrode includes a comb-shaped electrode including multiple electrode fingers aligned in the propagation direction.

According to the exemplary aspects of the present invention, a resonator is provided that has excellent frequency temperature characteristics and/or resonance characteristics.

DETAILED DESCRIPTION OF EMBODIMENTS

Figure 1:
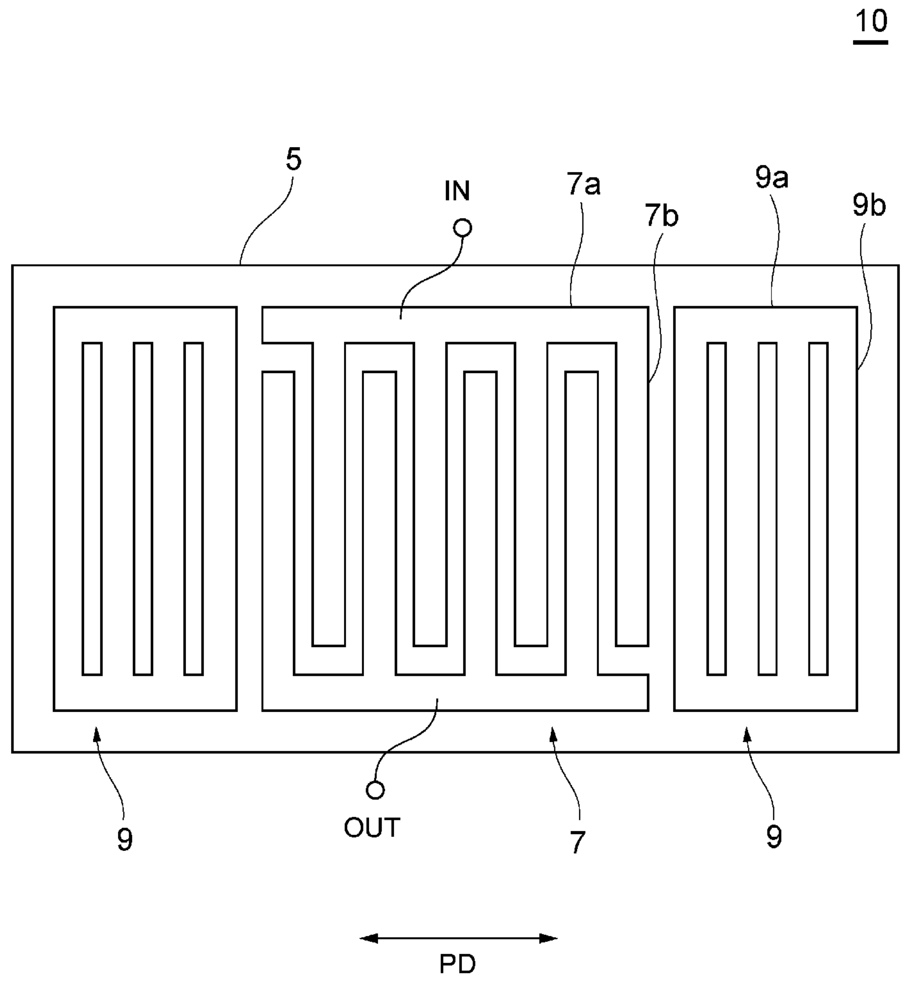
FIG. 1 is a plan view schematically illustrating a configuration of a resonator according to an exemplary embodiment.

An exemplary embodiment of the present invention will be described below. In the following description of the drawings, the same or similar components are denoted by the same or similar reference numerals. The drawings are examples, and dimensions and shapes of individual parts are schematic, and the technical scope of the present invention should not be interpreted as being limited to that of the embodiment.

Figure 2:
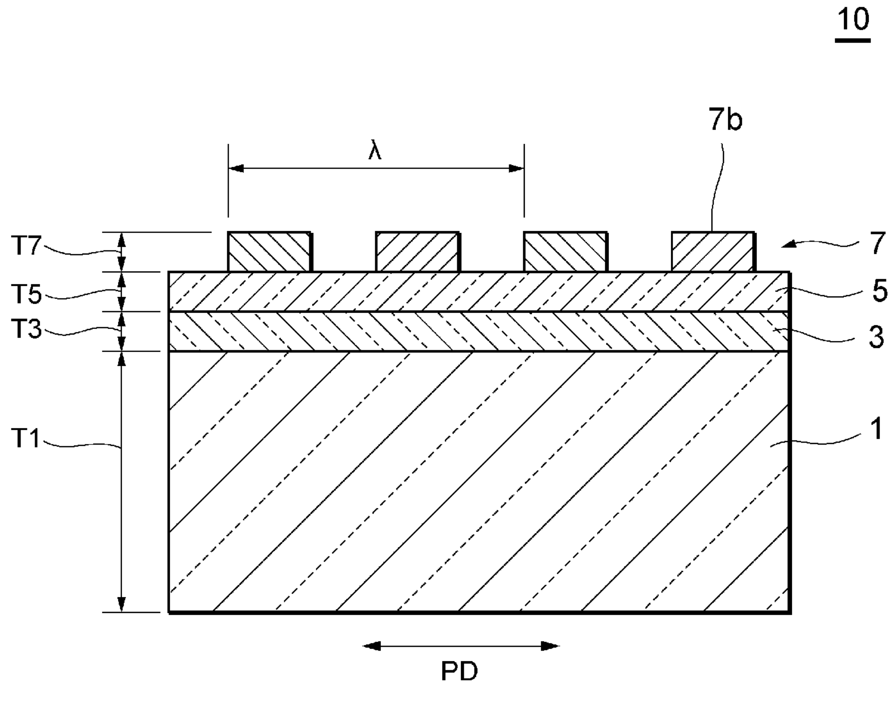
FIG. 2 is a sectional view schematically illustrating the configuration of the resonator illustrated in FIG. 1.
Figure 3:
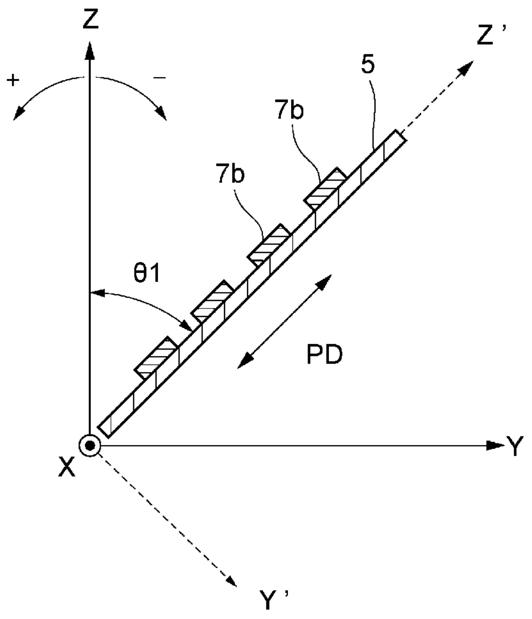
FIG. 3 is a view for explaining a crystal axis direction of a piezoelectric layer illustrated in FIG. 1.

First, a schematic configuration of a resonator 10 according to the exemplary embodiment will be described with reference to FIGS. 1 to 3. FIG. 1 is a plan view schematically illustrating the configuration of the resonator according to the embodiment. FIG. 2 is a sectional view schematically illustrating the configuration of the resonator illustrated in FIG. 1. FIG. 3 is a view for explaining a crystal axis direction of a piezoelectric layer illustrated in FIG. 1.

In general, the resonator 10 is a type of SAW resonator, and is a surface transverse wave (STW) element that guides a surface skimming bulk wave (SSBW). As illustrated in FIGS. 1 and 2, the resonator 10 includes a high acoustic velocity substrate 1, a low acoustic velocity layer 3, a piezoelectric layer 5, an inter digital transducer (IDT) electrode 7, and a pair of reflectors 9.

The high acoustic velocity substrate 1 is a substrate that minimizes any decrease in a Q factor due to leakage of vibrational energy in the piezoelectric layer 5 as bulk waves. To be specific, for example, as illustrated in FIG. 2, the high acoustic velocity substrate 1 is a single layer substrate in which an acoustic velocity (e.g., propagation velocity of acoustic waves) in a propagation direction PD is higher than an acoustic velocity in the piezoelectric layer 5 in the propagation direction PD. For purposes of this disclosure, the term "acoustic velocity in the propagation direction PD" is also simply referred to as "acoustic velocity". The acoustic velocity in the high acoustic velocity substrate 1 is higher than the acoustic velocity in the piezoelectric layer 5 preferably by 10% or more, more preferably by 20% or more, and still more preferably by 40% or more.

In an exemplary aspect, the high acoustic velocity substrate 1 can be made of, for example, a single crystal of silicon, but it is not so limited thereto. For example, the high acoustic velocity substrate 1 may be made of any one of single silicon (amorphous silicon, polycrystalline silicon, etc.), a silicon compound (silicon oxide, silicon nitride, silicon carbide, etc.), and an aluminum compound (aluminum nitride, aluminum oxide, etc.) according to various exemplary aspects. As will be described later, the piezoelectric layer 5 is made of quartz crystal. The high acoustic velocity substrate 1 may also be made of quartz crystal as long as a crystal axis direction can be set so as to ensure a sufficient acoustic velocity difference between the high acoustic velocity substrate 1 and the piezoelectric layer 5 in the propagation direction PD. In this case, the high acoustic velocity substrate 1 and the piezoelectric layer 5 may be made from quartz crystals having cut-angles different from each other. As a specific example, the quartz crystal of the piezoelectric layer 5 may be a BT-cut quartz crystal, which will be described later, and may be provided such that a crystal X-axis is 90°±10° to the propagation direction PD, and the quartz crystal of the high acoustic velocity substrate 1 may be an AT-cut quartz crystal, which will be described later, and may be provided such that a crystal X-axis is 90°±10° to the propagation direction PD. That is, the cut-angles of the quartz crystal of the high acoustic velocity substrate 1 may be expressed by Euler angles as (λ, μ, θ)=(0°, 125°±10°, 90°±10°), and the cut-angles of the quartz crystal of the piezoelectric layer 5 may be expressed by the Euler angles as (λ, μ, θ)=(0°, 31°±10°, 90°±10°). This configuration allows a larger difference in the acoustic velocity between the high acoustic velocity substrate 1 and the piezoelectric layer 5. It is also noted that the cut-angles of the quartz crystal forming the high acoustic velocity substrate 1 is not limited to the above as long as the acoustic velocity in the high acoustic velocity substrate 1 is sufficiently higher than the acoustic velocity in the piezoelectric layer 5 in the propagation direction PD. The high acoustic velocity substrate 1 may be made from a quartz crystal having cut-angles obtained by rotating a plane orthogonal to a crystal Y-axis in a range of 0° to 60° inclusive counterclockwise when viewed from a positive direction side of a crystal X-axis.

It is also noted that the high acoustic velocity substrate is not limited to having a single layer structure illustrated in FIG. 2, but may have a multilayer structure in other exemplary aspects. When the high acoustic velocity substrate has the multilayer structure, when an acoustic velocity in a layer closest to the piezoelectric layer 5 in the multilayer structure is higher than the acoustic velocity in the piezoelectric layer 5, acoustic velocities of the other layers in the multilayer structure may be equal to or lower than the acoustic velocity in the piezoelectric layer 5. The layer closest to the piezoelectric layer 5 of the high acoustic velocity substrate having the multilayer structure preferably has the same acoustic velocity as that of the high acoustic velocity substrate 1 described above, and is preferably made of the same material as that of the high acoustic velocity substrate 1 described above.

In general, the thicker a thickness T1 of the high acoustic velocity substrate 1 is, the more leakage of vibrational energy from the piezoelectric layer 5 can be reduced. In addition, the high acoustic velocity substrate 1 preferably has mechanical strength capable of supporting a stacked structure including the low acoustic velocity layer 3, the piezoelectric layer 5, the IDT electrode 7, and the reflectors 9. Thus, when λ is a wavelength of the acoustic wave, the thickness T1 of the high acoustic velocity substrate 1 is preferably 50λ or more, more preferably 100λ or more, and still more preferably 500λ or more.

According to the exemplary aspect, the low acoustic velocity layer 3 is a layer configured to confine vibrational energy that has characteristics of inherently being concentrated on a low acoustic velocity medium and for reducing leakage of vibrational energy from the piezoelectric layer 5 to the high acoustic velocity substrate 1. To be specific, the low acoustic velocity layer 3 is a layer in which the acoustic velocity in the propagation direction PD is equal to or lower than the acoustic velocity in the piezoelectric layer 5 in the propagation direction PD. The low acoustic velocity layer 3 is stacked directly on the high acoustic velocity substrate 1. This means that a functional member such as an adhesive is not present between the high acoustic velocity substrate 1 and the low acoustic velocity layer 3, and the high acoustic velocity substrate 1 and the low acoustic velocity layer 3 are in contact with each other. Direct stacking is achieved, for example, by direct bonding such as diffusion bonding or room temperature bonding, or by direct deposition by PVD, CVD, or the like. At a boundary between members in the direct stacking, a composition ratio may change sharply or gradually. The same applies to direct stacking on other layers and substrates.

According to an exemplary aspect, the low acoustic velocity layer 3 can be made of, for example, silicon oxide to improve frequency temperature characteristics due to a temperature compensation effect. However, the material of the low acoustic velocity layer 3 is not limited to silicon oxide, and may be, for example, silicon oxynitride, tantalum oxide, or a compound obtained by adding fluorine, carbon, or boron to these materials in various exemplary aspects.

A thickness T3 of the low acoustic velocity layer 3 is preferably set in a range of 0.01λ to 2.0λ inclusive, and more preferably in a range of 0.1λ to 0.5λ inclusive. By setting the thickness T3 in a range of 2.0λ or less, an electromechanical coupling coefficient can be easily adjusted. By setting the thickness T3 in a range of 0.01λ or more, leakage of vibrational energy from the piezoelectric layer 5 can be reduced sufficiently. Further, from the viewpoint of reducing warpage of the resonator 10 due to stress in the low acoustic velocity layer 3, the thickness T3 of the low acoustic velocity layer 3 is preferably 1/100 or less of the thickness T1 of the high acoustic velocity substrate 1. It is noted that the low acoustic velocity layer 3 may be omitted. That is, the piezoelectric layer 5 and the high acoustic velocity substrate 1 may be directly stacked on each other.

In operation, the piezoelectric layer 5 is a layer that is configured to convert electrical vibrational energy and mechanical vibrational energy into each other and propagates the mechanical vibrational energy as SSBWs. The piezoelectric layer 5 is stacked directly on the low acoustic velocity layer 3. As illustrated in FIG. 3, the piezoelectric layer 5 is made from a quartz crystal (e.g., rotated Y-cut quartz crystal substrate) having cut-angles obtained by rotating a plane orthogonal to a crystal Y-axis about a crystal X-axis at a rotation angle θ1. In addition, the piezoelectric layer 5 is provided such that a direction at 90°±10° to the crystal X-axis is the propagation direction PD. That is, the propagation direction PD is a direction along a Z'-axis obtained by rotating a crystal Z-axis about the crystal X-axis by the rotation angle θ1. Here, when viewed from a positive direction side of the crystal X-axis (e.g., from a front side to a back side of the paper in FIG. 3), a counterclockwise direction is positive (+) and a clockwise direction is negative (−), and the rotation angle θ1 includes 0. The cut-angles of this quartz crystal are (0°, θ1+90°, 90°±10°) when expressed by Euler angles.

According to an exemplary aspect, the quartz crystal of the piezoelectric layer 5 is a BT-cut quartz crystal, and θ1=−59°±10°. The cut-angles of this quartz crystal are expressed by (λ, μ, θ)=(0°, θ1+90°, 90°±) 10°)=(0°, 31°±10°, 90°±10°) in the Euler angles. As another example, the quartz crystal of the piezoelectric layer 5 is an AT-cut quartz crystal, and θ1=35°±10°. The cut-angles of this quartz crystal are expressed by (λ, μ, =(0°, θ1+90°, 90°±10) °=(0°, 125°±10°, 90°±10°) in the Euler angles.

Moreover, a thickness T5 of the piezoelectric layer is preferably set in a range of 0.02λ to 1.0λ inclusive, more preferably in a range of 0.05λ to 0.5λ inclusive, and still more preferably in a range of 0.1λ to 0.5λ inclusive. This configuration allows an electromechanical coupling coefficient to be easily adjusted in a wide range. Further, from the viewpoint of reducing leakage of vibrational energy from the piezoelectric layer 5, the thickness T5 of the piezoelectric layer 5 is preferably 1/100 or less of the thickness T1 of the high acoustic velocity substrate 1.

As further shown in FIG. 1, for example, the IDT electrode 7 is a comb-shaped electrode. In the example illustrated in FIG. 1, the IDT electrode 7 includes a pair of busbars **7*a* and multiple electrode fingers 7*b*. The pair of busbars 7*a* extend along the propagation direction PD and are arranged so as to be spaced apart from each other in a direction orthogonal to the propagation direction PD. The multiple electrode fingers 7*b* extend from each of the pair of busbars 7*a* in the direction orthogonal to the propagation direction PD and are arranged along the propagation direction PD. The multiple electrode fingers 7*b* extending from one busbar 7*a* and the multiple electrode fingers 7*b* extending from the other busbar 7*a* are alternately arranged along the propagation direction PD. With the crystal axis direction of the piezoelectric layer 5 as a reference, as illustrated in FIG. 3, the multiple electrode fingers 7*b* extend in the crystal X-axis direction and are aligned along the Z'-axis direction obtained by rotating the crystal Z-axis about the crystal X-axis at the rotation angle θ1. An electrode period of the electrode fingers 7*b* determines the wavelength A of the acoustic wave. In other words, respective edges on a side of the −Z'-axis direction of the two adjacent electrode fingers 7*b*** electrically coupled to each other are spaced apart by the distance A in the Z'-axis direction.

According to the exemplary embodiment, the pair of reflectors 9 are grating-type reflectors for reflecting SAWS and improving the Q factor. The pair of reflectors 9 are arranged with the IDT electrode 7 interposed therebetween in the propagation direction PD. Each of the pair of reflectors 9 includes a pair of reflector busbars **9*a* each extending along the propagation direction PD and spaced apart from each other in the direction orthogonal to the propagation direction PD, and multiple (e.g., a plurality of) reflector electrode fingers 9*b* connecting the pair of reflector busbars 9*a*** and aligned in the propagation direction PD. Four reflector electrode fingers are shown in the exemplary aspect.

The IDT electrode 7 and the reflectors 9 are provided on the piezoelectric layer 5. In an exemplary aspect, the IDT electrode 7 and the reflectors 9 are made of, for example, a metal containing aluminum as a main component, but are not limited thereto. For example, in alternative aspects, the IDT electrode 7 and the reflectors 9 can be made of copper, platinum, gold, silver, titanium, nickel, chromium, molybdenum, tungsten, or an alloy containing any of these metals as a main component. A thickness T7 of the IDT electrode 7 and the reflectors 9 is preferably set in a range of 0.01λ to 0.2λ inclusive, more preferably in a range of 0.02λ to 0.15λ inclusive, and still more preferably in a range of 0.04λ to 1.0λ inclusive.

Figure 4:
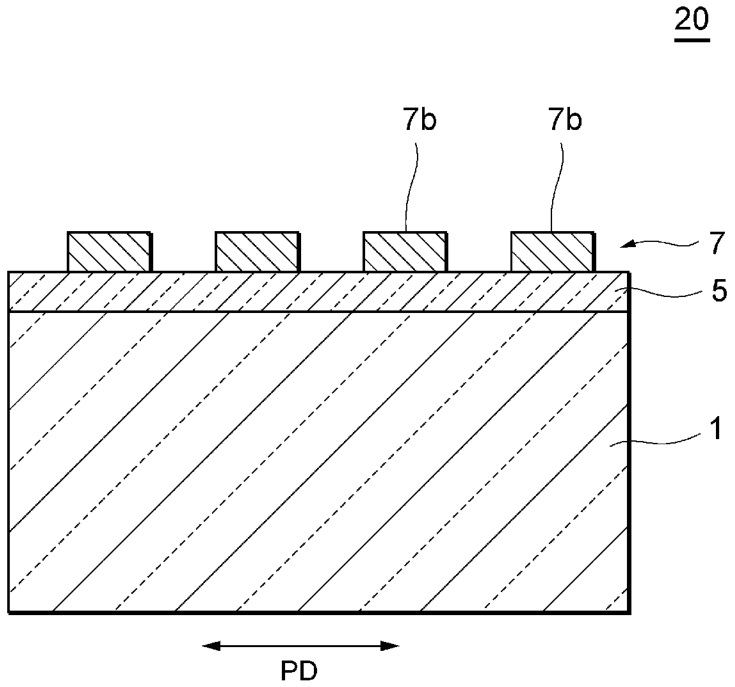
FIG. 4 is a sectional view schematically illustrating a configuration of a resonator according to a modification of the exemplary embodiment.
Figure 5:
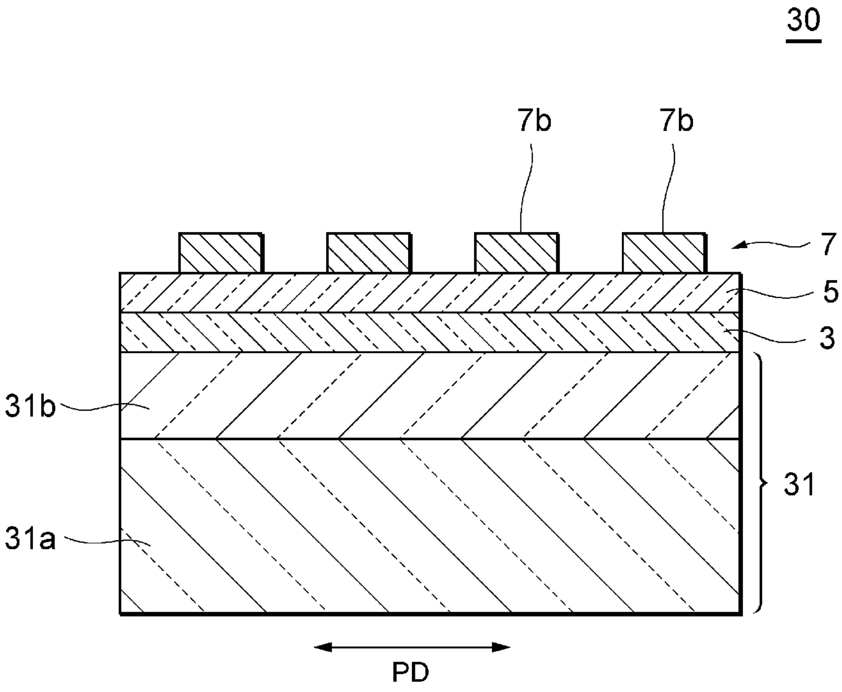
FIG. 5 is a sectional view schematically illustrating a configuration of a resonator according to another modification of the exemplary embodiment.

Next, modifications of the present embodiment will be described with reference to FIGS. 4 and 5. FIGS. 4 and 5 are sectional views schematically illustrating configurations of resonators according to the modifications of the exemplary embodiment.

As illustrated in FIG. 4, the high acoustic velocity substrate 1 and the piezoelectric layer 5 included in a resonator 20 may be directly stacked on each other. In this case, since the low acoustic velocity layer is omitted, in order to reduce leakage of vibrational energy from the piezoelectric layer 5 to the high acoustic velocity substrate 1, the acoustic velocity in the high acoustic velocity substrate 1 is preferably higher than the acoustic velocity in the piezoelectric layer 5 by 20% or more.

As illustrated in FIG. 5, a high acoustic velocity substrate 31 of a resonator 30 may include a support substrate 31*a* and a high acoustic velocity layer 31*b* stacked on the support substrate 31*a*. The high acoustic velocity layer 31*b* is, for example, directly stacked on the support substrate 31*a*. However, the stacked structure is not limited to this configuration, the high acoustic velocity layer 31*b* may be stacked on the support substrate 31*a* via a bonding member such as an adhesive.

The material of the support substrate 31*a* is not limited as long as the support substrate 31*a* is configured to support a stacked structure including the high acoustic velocity layer 31*b*, the low acoustic velocity layer 3, the piezoelectric layer 5, the IDT electrode 7, and the reflectors 9. For example, the support substrate 31*a* can be made of a piezoelectric material such as sapphire, lithium tantalate, lithium niobate, or quartz crystal; any of various ceramics such as alumina, magnesia, silicon nitride, aluminum nitride, silicon carbide, zirconia, cordierite, mullite, steatite, and forsterite; a dielectric such as glass; a semiconductor such as silicon or gallium nitride; or a resin substrate.

As further shown, the high acoustic velocity layer 31*b* is disposed between the support substrate 31*a* and the low acoustic velocity layer 3. An acoustic velocity in the high acoustic velocity layer 31*b* in the propagation direction PD is higher than the acoustic velocity in the piezoelectric layer 5 in the propagation direction PD. The high acoustic velocity layer 31*b* can be made of the same material as that of the high acoustic velocity substrate 1. The thicker a thickness of the high acoustic velocity layer 31*b* is, the more leakage of vibrational energy from the piezoelectric layer 5 can be reduced. Thus, the thickness of the high acoustic velocity layer 31*b* is preferably 0.5λ or more, and more preferably 1.5λ or more. However, from the viewpoint of manufacturing capability, the thickness of the high acoustic velocity layer 31*b* is preferably 10λ or less.

Figure 6:
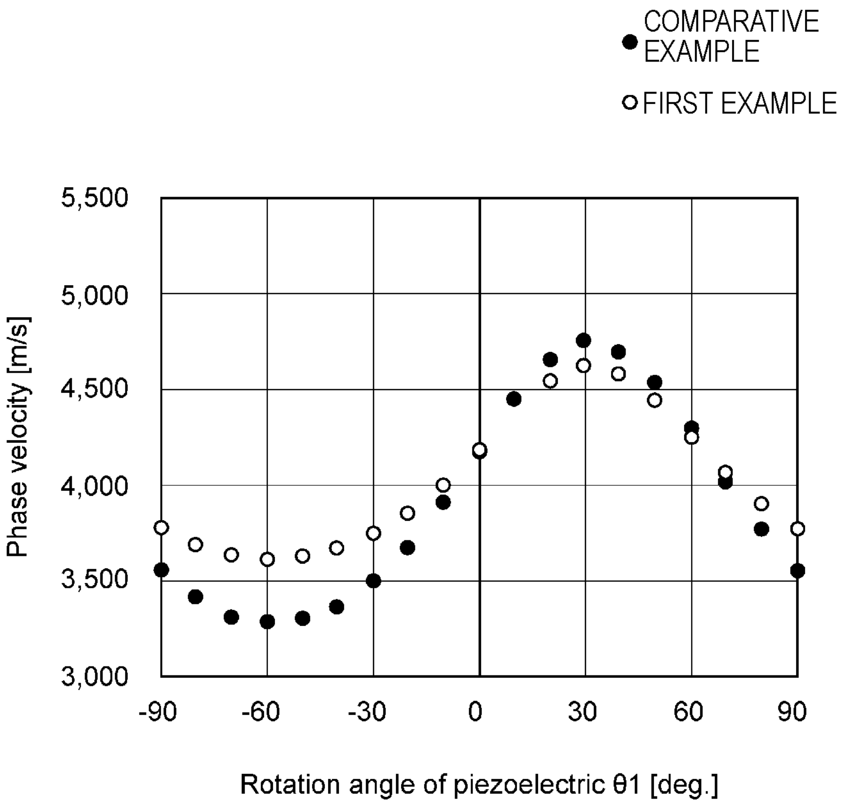
FIG. 6 is a graph showing a relationship between a rotation angle of the piezoelectric layer in a first example and an acoustic velocity.
Figure 7:
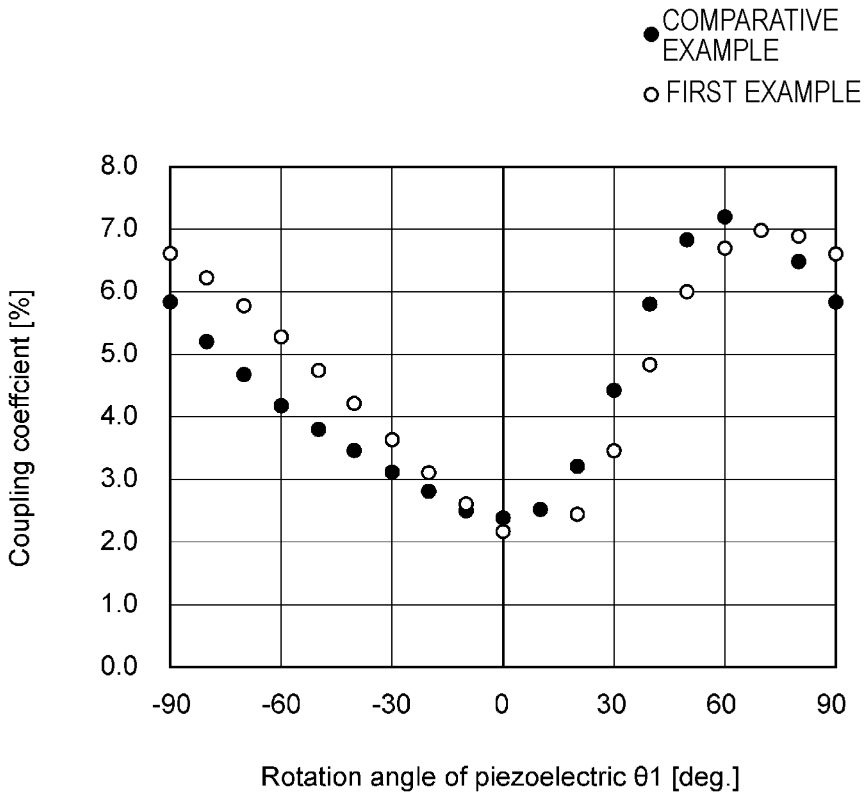
FIG. 7 is a graph showing a relationship between the rotation angle of the piezoelectric layer in the first example and an electromechanical coupling coefficient.
Figure 8:
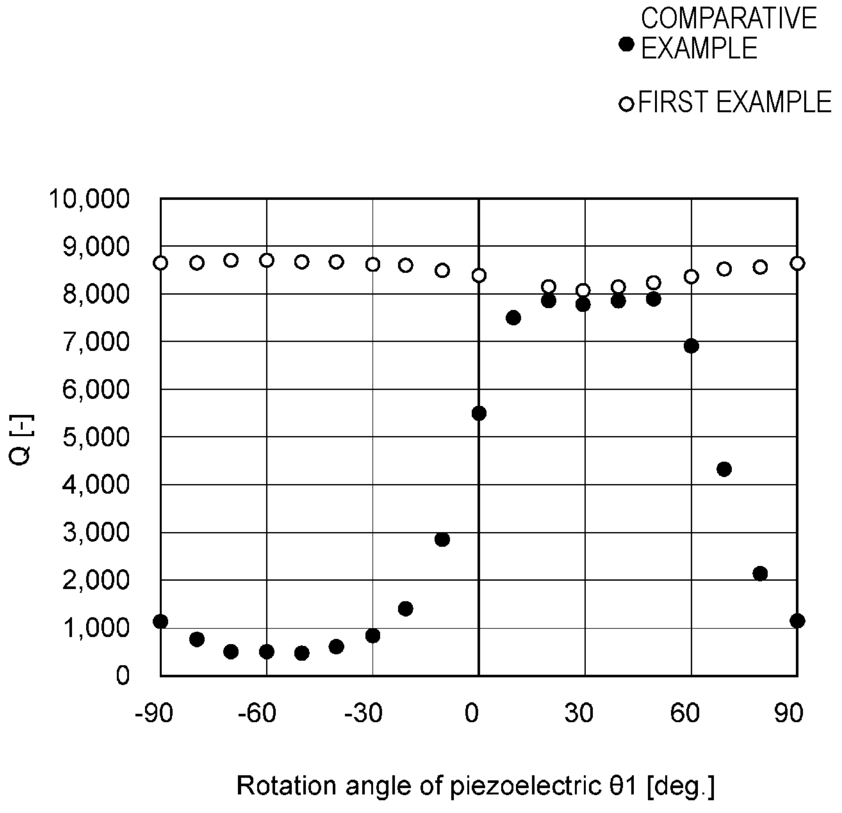
FIG. 8 is a graph showing a relationship between the rotation angle of the piezoelectric layer in the first example and a Q factor.

Next, resonance characteristics in an example of the present embodiment will be described with reference to FIGS. 6 to 8. FIG. 6 is a graph showing a relationship between a rotation angle of the piezoelectric layer in a first example and the acoustic velocity. FIG. 7 is a graph showing a relationship between the rotation angle of the piezoelectric layer in the first example and the electromechanical coupling coefficient. FIG. 8 is a graph showing a relationship between the rotation angle of the piezoelectric layer in the first example and the Q factor.

The resonator 10 according to the first example includes the high acoustic velocity substrate 1, the low acoustic velocity layer 3 stacked on the high acoustic velocity substrate 1, the piezoelectric layer 5 stacked on the low acoustic velocity layer 3, and the IDT electrode 7 and the reflectors 9 formed on the piezoelectric layer 5. The following parameters are provided for this example:

Acoustic wave: wavelength λ=4 μm, frequency f=1 GHz

High acoustic velocity substrate 1: silicon (single crystal), T1=300 μm

Low acoustic velocity layer 3: silicon oxide (amorphous), T3=0.8 μm

Piezoelectric layer 5: quartz crystal, Euler angles (0°, $\theta 1$+90°, 90°), T5=2 μm IDT electrode 7: aluminum, T7=0.2 μm A resonator according to a comparative example is a resonator in which the high acoustic velocity substrate 1 and the low acoustic velocity layer 3 are omitted from the configuration in the first example and the piezoelectric layer 5 is a single layer. Several resonance characteristics in the first example and the comparative example were simulated.

In the graph in FIG. 6, a horizontal axis represents the rotation angle of the piezoelectric layer (Rotation angle of piezoelectric) 01, and a vertical axis represents a SAW velocity (Phase velocity) (unit: m/s). In ranges of $-90° \leq \theta 1 \leq 0°$ and $60° \leq \theta 1 \leq 90°$, the SAW velocity in the first example is higher than the SAW velocity in the comparative example. In other words, within these ranges, the first example is more advantageous than the comparative example in increasing the frequency. In particular, in a range of $\theta 1 = -59° \pm 10°$, an increase in the SAW velocity is large. For example, at $\theta 1 = -59°$, the SAW velocity in the comparative example was 3300 m/s or less, whereas the SAW velocity in the first example increased to 3500 m/s or more.

In the graph in FIG. 7, a horizontal axis represents the rotation angle of the piezoelectric layer (Rotation angle of piezoelectric) 01 and a vertical axis represents the electromechanical coupling coefficient (Coupling coefficient) (unit: %). In ranges of $-90° \leq \theta 1 \leq 0°$ and $70° \leq \theta 1 \leq 90°$, the electromechanical coupling coefficient in the first example is higher than the electromechanical coupling coefficient in the comparative example. That is, in these ranges, the first example has oscillation characteristics, as an oscillator, superior to those in the comparative example and may have bandwidth, as a filter, wider than that in the comparative example.

In the graph in FIG. 8, a horizontal axis represents the rotation angle of the piezoelectric layer (Rotation angle of piezoelectric) $\theta 1$, and a vertical axis represents the Q factor (Q). In an entire range of $\theta 1$, the Q factor in the first example is larger than the Q factor in the comparative example. That is, in the entire range of $\theta 1$, the first example has oscillation characteristics, as an oscillator, superior to those in the comparative example, may have phase noise smaller than that in the comparative example, and may have, as a filter, insertion loss smaller than that in the comparative example. In particular, in a range of $\theta 1 = -59° \pm 10°$, an increase in the Q factor is large. For example, at $\theta 1 = -59°$, the Q factor in the comparative example was 1000 or less, whereas the Q factor in the first example increased to 8000 or more.

Figure 9:
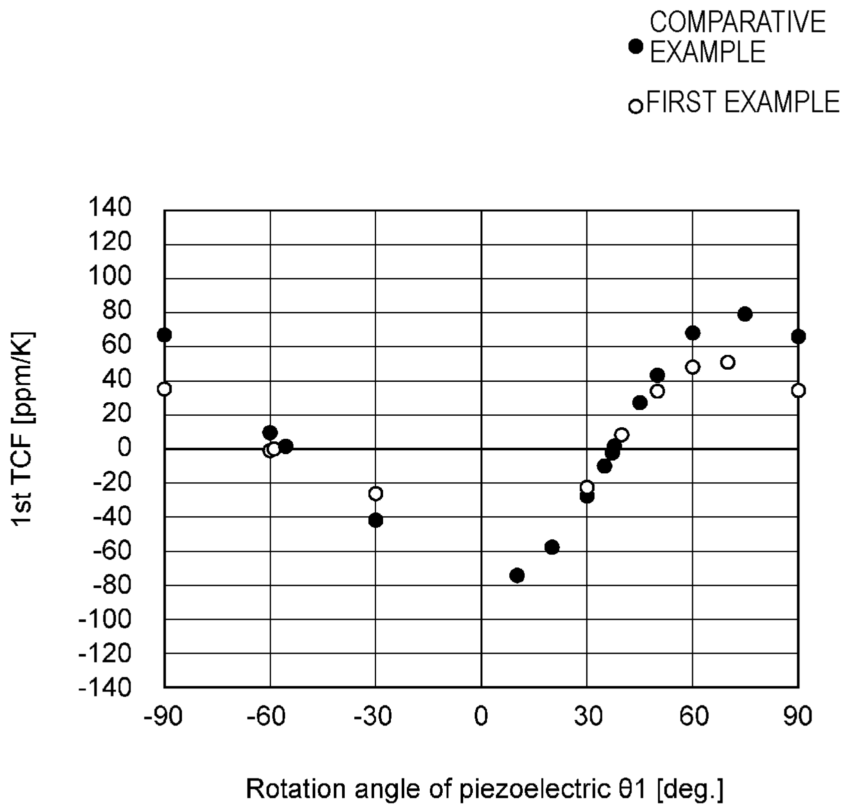
FIG. 9 is a graph showing a relationship between the rotation angle of the piezoelectric layer in the first example and a first-order temperature coefficient of frequency.
Figure 10:
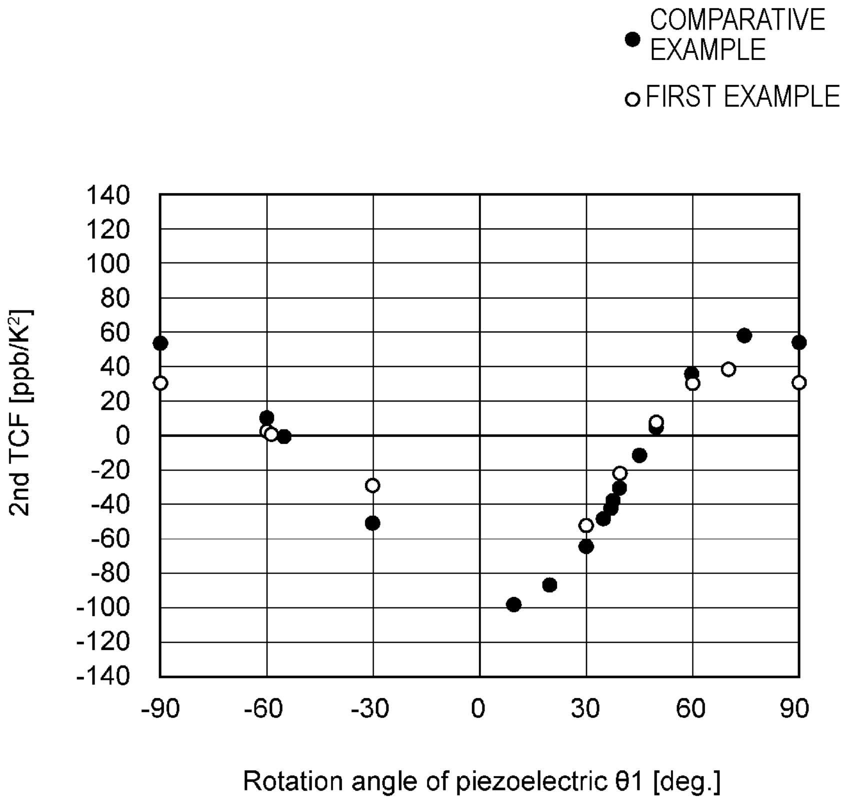
FIG. 10 is a graph showing a relationship between the rotation angle of the piezoelectric layer in the first example and a second-order temperature coefficient of frequency.
Figure 11:
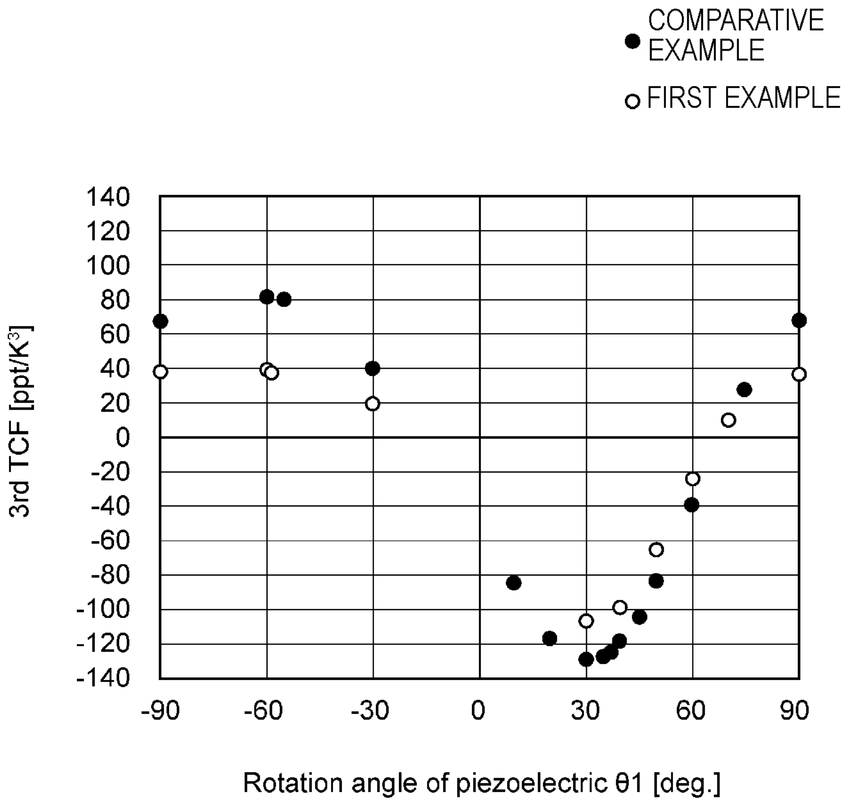
FIG. 11 is a graph showing a relationship between the rotation angle of the piezoelectric layer in the first example and a third-order temperature coefficient of frequency.
Figure 12:
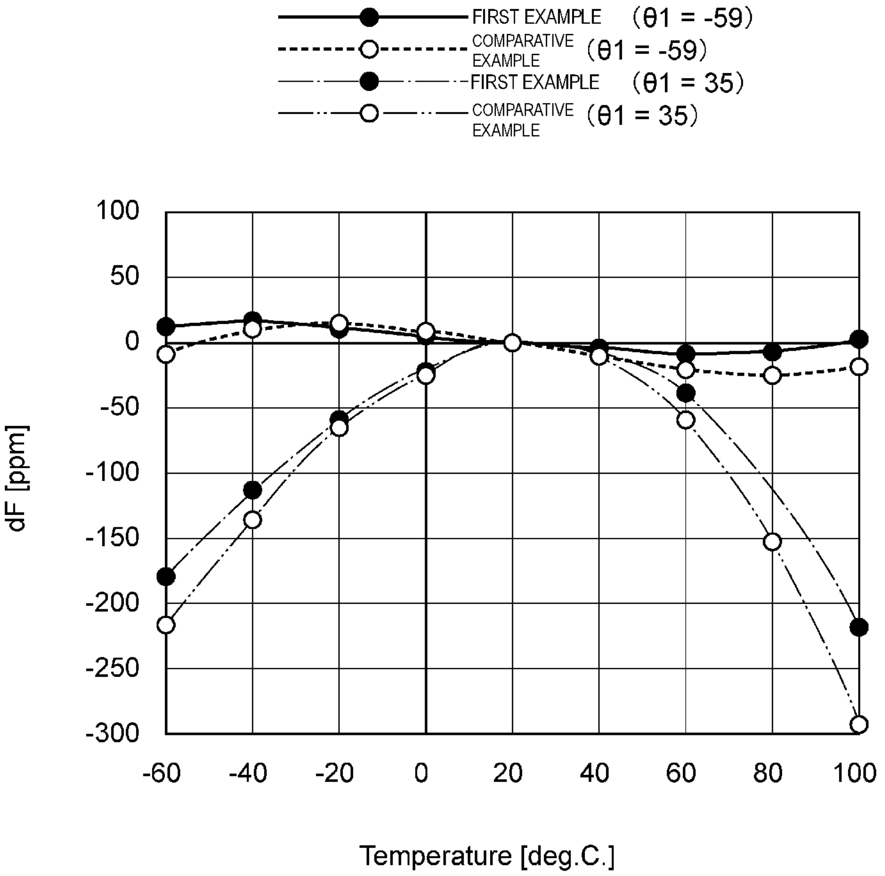
FIG. 12 is a graph showing frequency temperature characteristics in the first example.

Next, temperature characteristics in an example of the present embodiment will be described with reference to FIGS. 9 to 12. Temperature characteristics in the first example and the comparative example were simulated. FIG. 9 is a graph showing a relationship between the rotation angle of the piezoelectric layer in the first example and a first-order temperature coefficient of frequency. FIG. 10 is a graph showing a relationship between the rotation angle of the piezoelectric layer in the first example and a second-order temperature coefficient of frequency. FIG. 11 is a graph showing a relationship between the rotation angle of the piezoelectric layer in the first example and a third-order temperature coefficient of frequency. FIG. 12 is a graph showing frequency temperature characteristics in the first example.

In the graph in FIG. 9, a horizontal axis represents the rotation angle of the piezoelectric layer (Rotation angle of piezoelectric) θ1, and a vertical axis represents the first-order temperature coefficient of frequency (1st TCF). A unit of the vertical axis is ppm/K. In the graph in FIG. 10, a horizontal axis represents the rotation angle of the piezoelectric layer (Rotation angle of piezoelectric) θ1, and a vertical axis represents the second-order temperature coefficient of frequency (2nd TCF). A unit of the vertical axis is ppb/$K^2$. In the graph in FIG. 11, a horizontal axis represents the rotation angle of the piezoelectric layer (Rotation angle of piezoelectric) θ1, and a vertical axis represents the third-order temperature coefficient of frequency (3rd TCF). A unit of the vertical axis is ppt/$K^3$. In an entire range of θ1, an absolute value of the first-order temperature coefficient of frequency in the first example is smaller than an absolute value of the first-order temperature coefficient of frequency in the comparative example. The same applies to the second-order temperature coefficient of frequency and the third-order temperature coefficient of frequency. In particular, in a range of θ1=−59°±10°, a decrease in the absolute value of the third-order temperature coefficient of frequency is large. For example, the third-order temperature coefficient of frequency in the comparative example at θ1=−59° was 80 ppt/$K^3$ or more, whereas the absolute value of the third-order temperature coefficient of frequency in the first example was reduced to 40 ppt/$K^3$ or less.

In the graph in FIG. 12, a horizontal axis represents a temperature (Temperature) (unit: ° C.), and a vertical axis represents an amount of frequency change (dF) (unit: ppm) with a frequency at 25° C. as a reference. The frequency temperature characteristics in the first example and the comparative example at θ1=−59°, and the frequency temperature characteristics in the first example and the comparative example at θ1=35° are plotted on the graph. In both cases of θ1=−59° and 35°, the frequency temperature characteristics in the first example is superior to the frequency temperature characteristics in the comparative example. In particular, in the first example, the frequency temperature characteristics is excellent at θ1=−59°, and an absolute value of the amount of frequency change in a high temperature range of 40° C. to 100° C. inclusive was 10 ppm or less.

Figure 13:
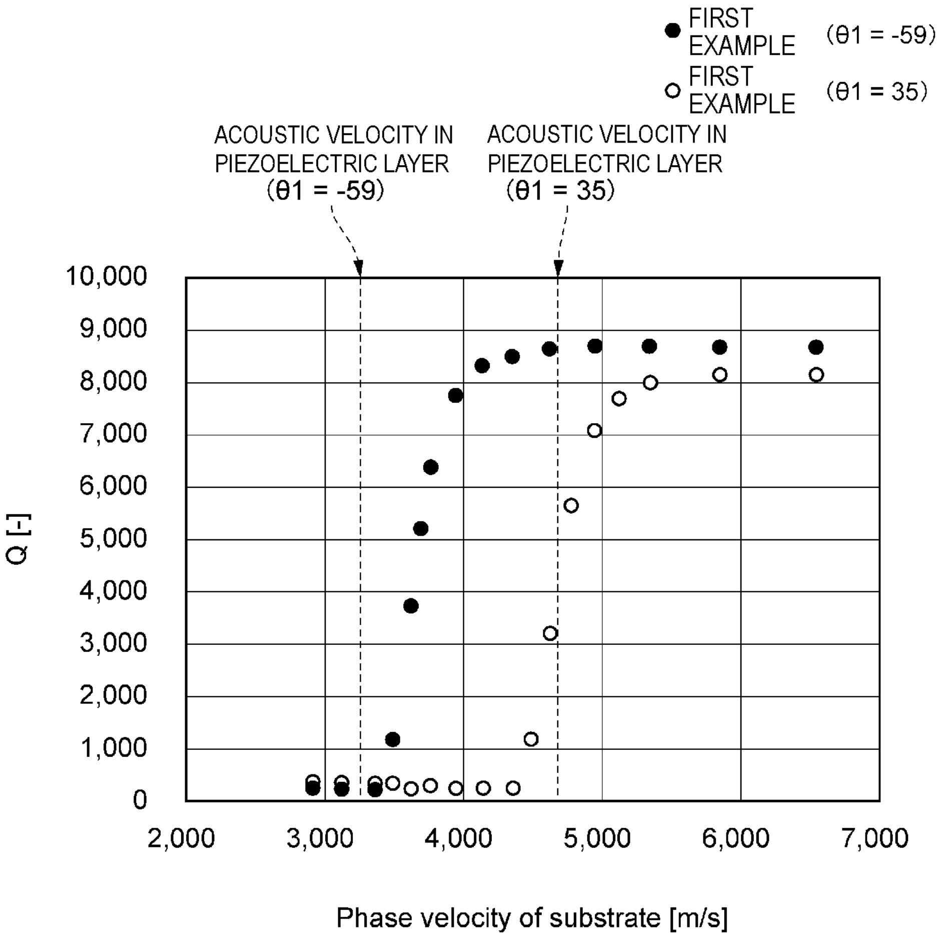
FIG. 13 is a graph for explaining an effect of an acoustic velocity in a high acoustic velocity substrate in the first example on the Q factor.

Next, with reference to FIG. 13, an effect of an acoustic velocity difference on the Q factor will be described. FIG. 13 is a graph for explaining the effect of the acoustic velocity in the high acoustic velocity substrate in the first example on the Q factor. FIG. 13 shows changes in the Q factors obtained by simulations in which the acoustic velocity in the high acoustic velocity substrate 1 in the configuration in the first example is changed.

In the graph in FIG. 13, a horizontal axis represents the acoustic velocity in the high acoustic velocity substrate 1 (Phase velocity of substrate) (unit: m/s), and a vertical axis represents the Q factor. The Q factors in the first example at θ1=−59° and the Q factors in the first example at θ1=35° are plotted on the graph. When the acoustic velocity in the high acoustic velocity substrate 1 is higher than the acoustic velocity in the piezoelectric layer 5 by 10% or more, the Q factor increases, when the acoustic velocity in the high acoustic velocity substrate 1 is higher than the acoustic velocity in the piezoelectric layer 5 by 20% or more, the Q factor becomes 8000 or more, and when the acoustic velocity in the high acoustic velocity substrate 1 is higher than the acoustic velocity in the piezoelectric layer 5 by 40% or more, the Q factor fully increases.

Figure 14:
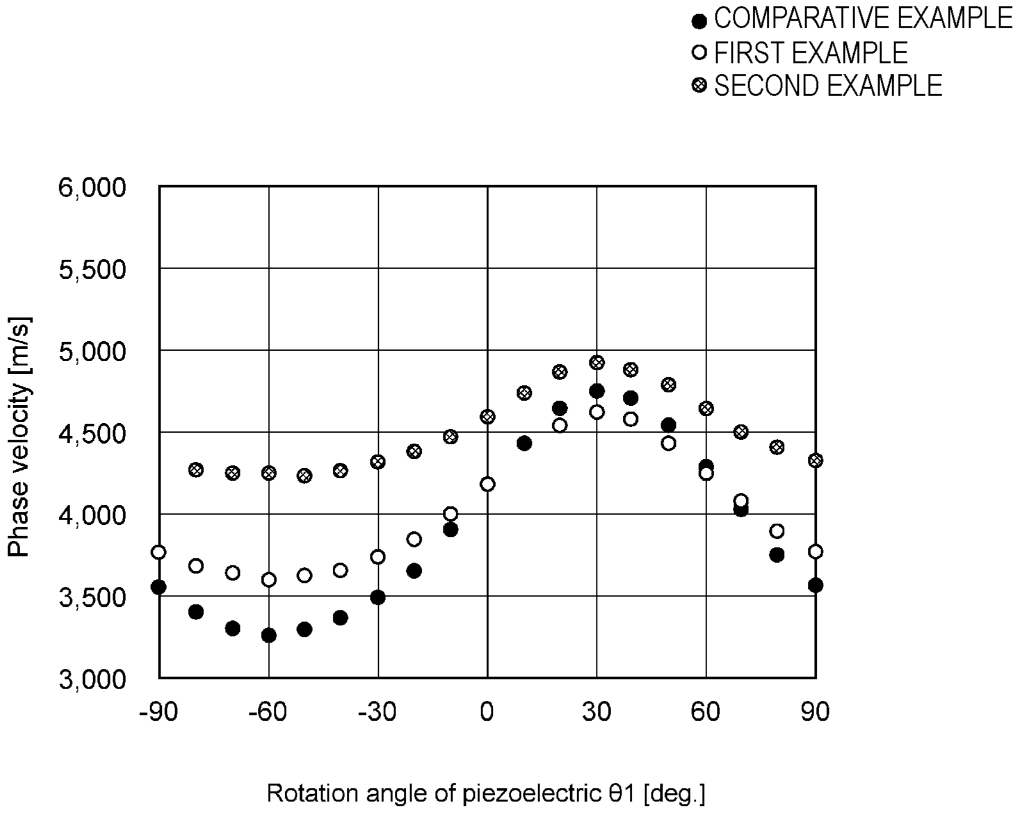
FIG. 14 is a graph showing a relationship between a rotation angle of a piezoelectric layer in a second example and the acoustic velocity.
Figure 15:
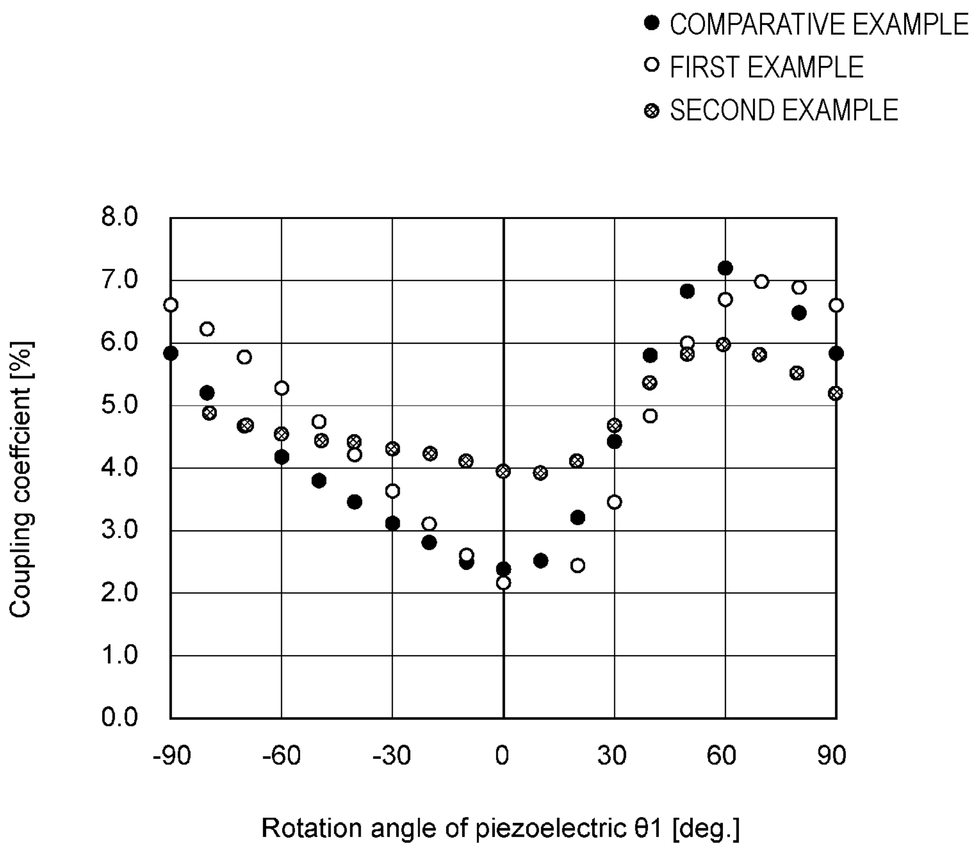
FIG. 15 is a graph showing a relationship between the rotation angle of the piezoelectric layer in the second example and the electromechanical coupling coefficient.
Figure 16:
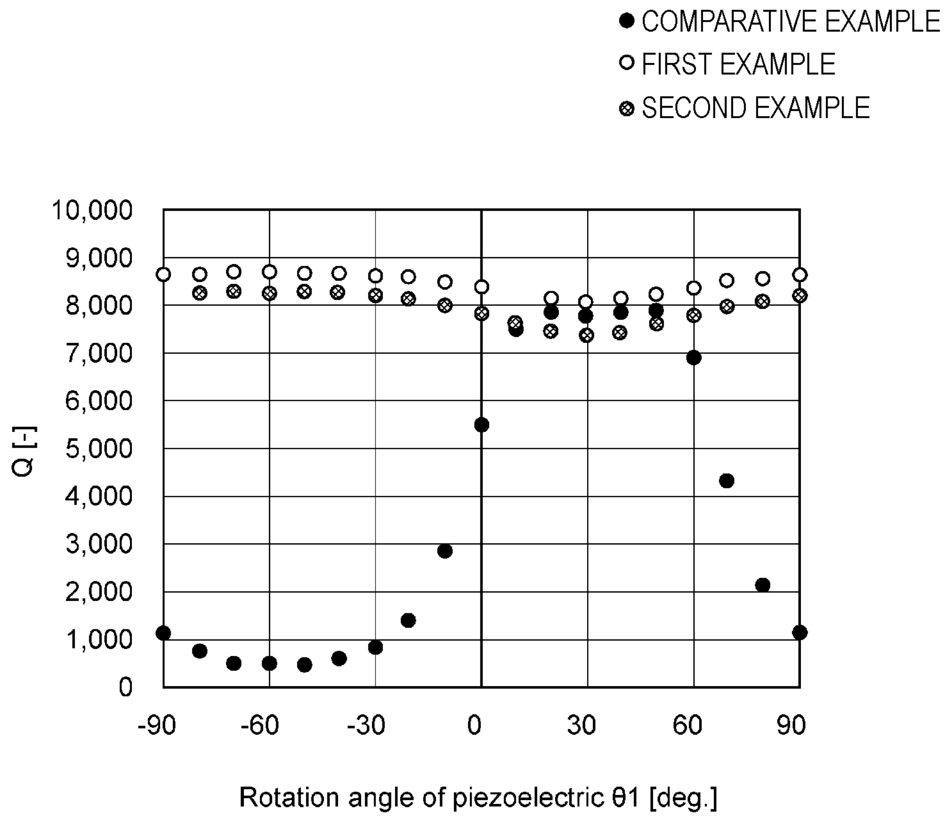
FIG. 16 is a graph showing a relationship between the rotation angle of the piezoelectric layer in the second example and the Q factor.

Next, with reference to FIGS. 14 to 16, resonance characteristics in an example of the present embodiment will be described. In particular, FIG. 14 is a graph showing a relationship between a rotation angle of a piezoelectric layer in a second example and the acoustic velocity. Moreover, FIG. 15 is a graph showing a relationship between the rotation angle of the piezoelectric layer in the second example and the electromechanical coupling coefficient. Furthermore, FIG. 16 is a graph showing a relationship between the rotation angle of the piezoelectric layer in the second example and the Q factor.

The second example is different from the first example in that the low acoustic velocity layer 3 is omitted and the piezoelectric layer 5 is directly bonded to the high acoustic velocity substrate 1. It is noted that other configurations in the second example are the same as those in the first example.

In the graph in FIG. 14, a horizontal axis represents the rotation angle of the piezoelectric layer (Rotation angle of piezoelectric) θ1, and a vertical axis represents the SAW velocity (Phase velocity) (unit: m/s). In an entire range of θ1, the SAW velocity in the second example is higher than the SAW velocity in the comparative example. In particular, in a range of θ1=−59°±10°, an increase in the SAW velocity is large. For example, at θ1=−59°, the SAW velocity in the comparative example was 3300 m/s or less, whereas the SAW velocity in the second example increased to 4200 m/s or more. It is noted that in the entire range of θ1, the SAW velocity in the second example is higher than the SAW velocity in the first example.

In the graph in FIG. 15, a horizontal axis represents the rotation angle of the piezoelectric layer (Rotation angle of piezoelectric) θ1 and a vertical axis represents the electromechanical coupling coefficient (Coupling coefficient) (unit: %). In a range of −70° 01 30°, the electromechanical coupling coefficient in the second example is higher than the electromechanical coupling coefficient in the comparative example. In particular, in a range of θ1=0°±10°, an increase in the electromechanical coupling coefficient is large. For example, at θ1=0°, the electromechanical coupling coefficient in the comparative example was 2.5% or less, whereas the electromechanical coupling coefficient in the second example increased to 3.8% or more. Note that in a range of −40°≤θ1≤40°, the electromechanical coupling coefficient in the second example is larger than the electromechanical coupling coefficient in the first example.

In the graph in FIG. 16, a horizontal axis represents the rotation angle of the piezoelectric layer (Rotation angle of piezoelectric) θ1, and a vertical axis represents the Q factor (Q). In ranges of −90°≤θ1≤10° and 50°≤θ1≤90°, the Q factor in the second example is higher than the Q factor in the comparative example. In particular, in a range of θ1=−59°±10°, an increase in the Q factor is large. For example, at θ1=−59°, the Q factor in the comparative example was 1000 or less, whereas the Q factor in the second example increased to 8000 or more. Note that in the entire range of θ1, the Q factor in the first example is larger than the Q factor in the second example.

Figure 17:
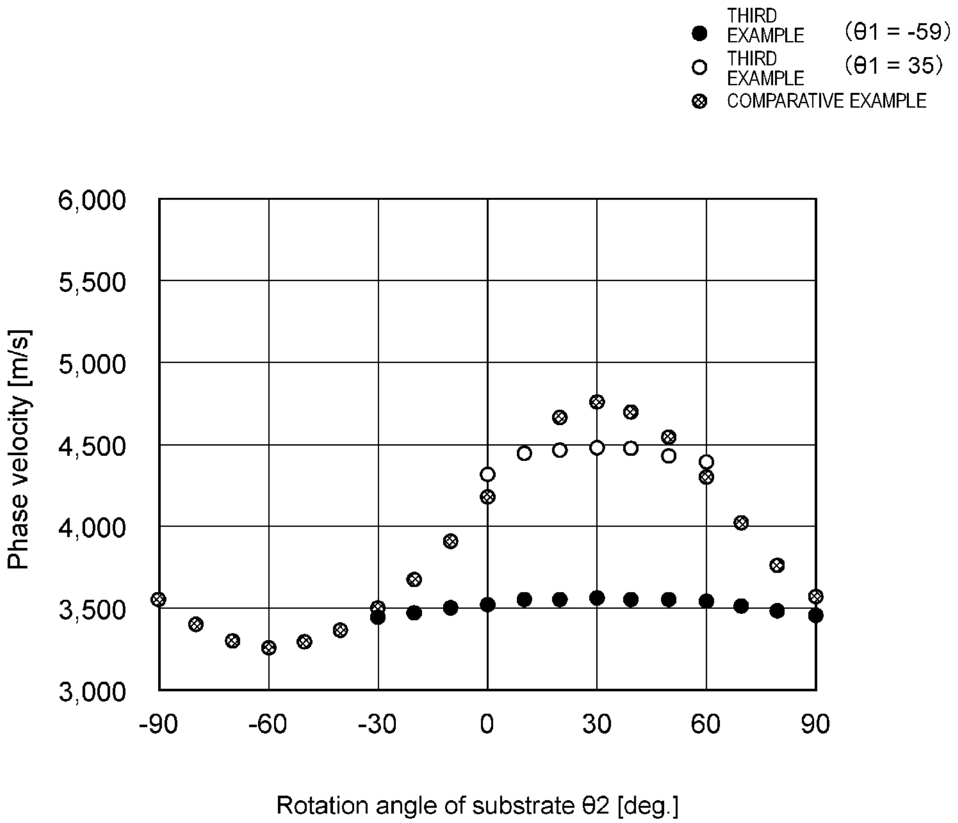
FIG. 17 is a graph showing a relationship between a rotation angle of a high acoustic velocity substrate in a third example and the acoustic velocity.
Figure 18:
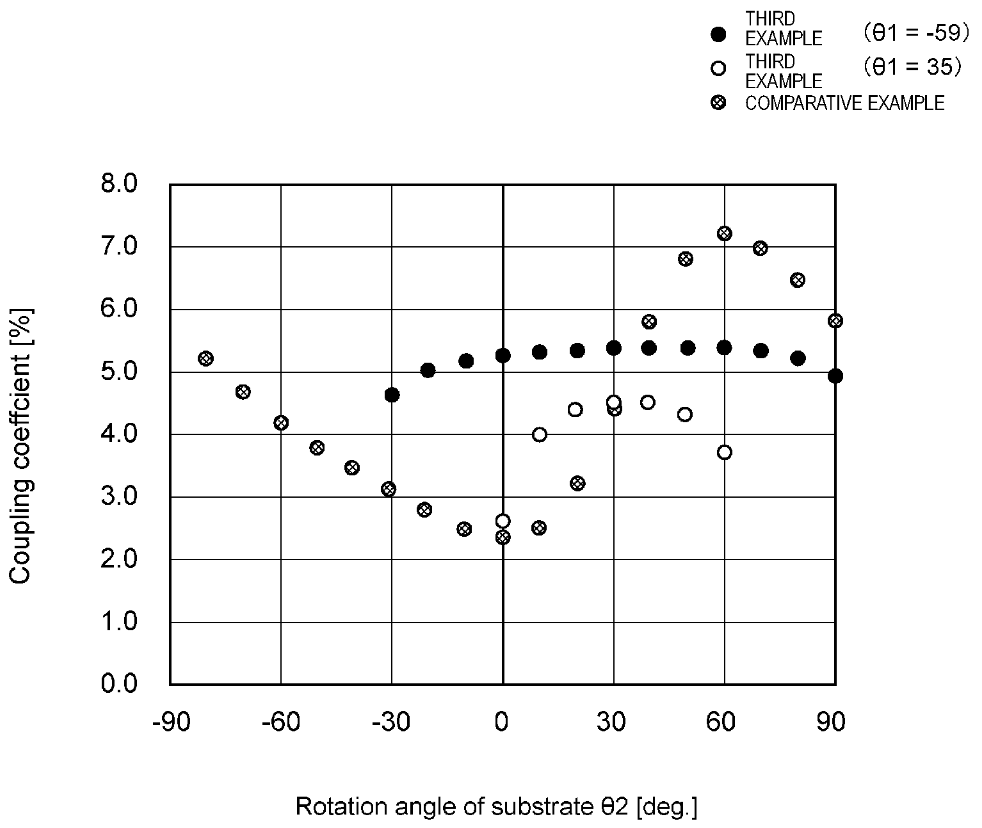
FIG. 18 is a graph showing a relationship between the rotation angle of the high acoustic velocity substrate in the third example and the electromechanical coupling coefficient.
Figure 19:
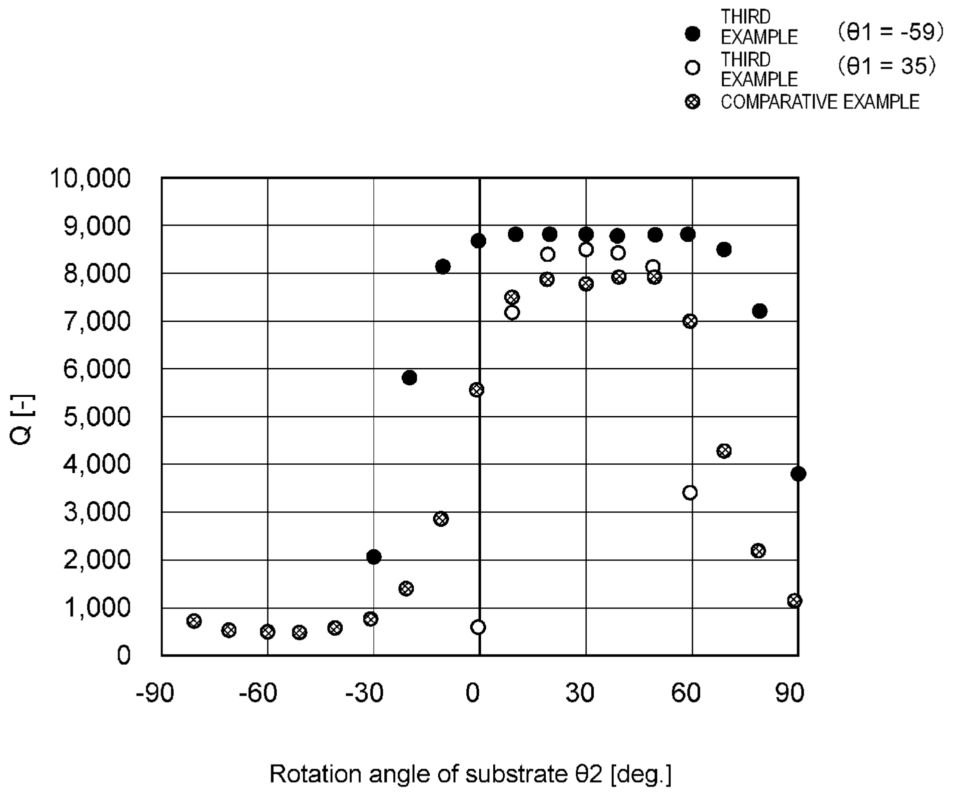
FIG. 19 is a graph showing a relationship between the rotation angle of the high acoustic velocity substrate in the third example and the Q factor.
Figure 20:
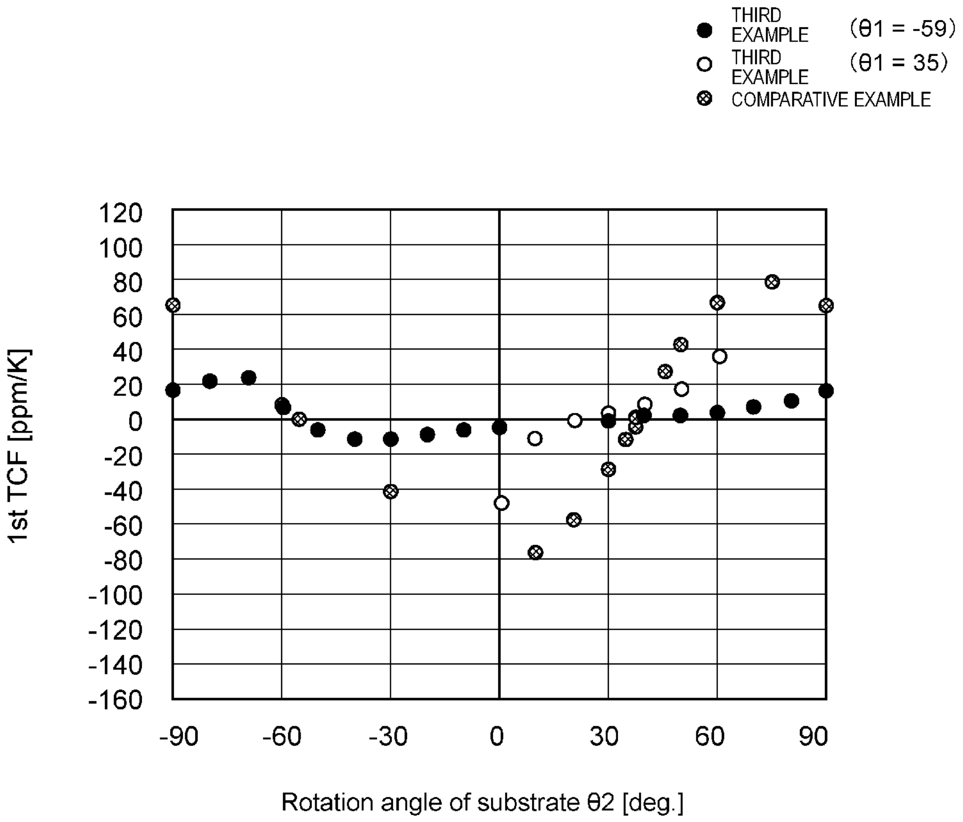
FIG. 20 is a graph showing a relationship between the rotation angle of the high acoustic velocity substrate in the third example and the first-order temperature coefficient of frequency.
Figure 21:
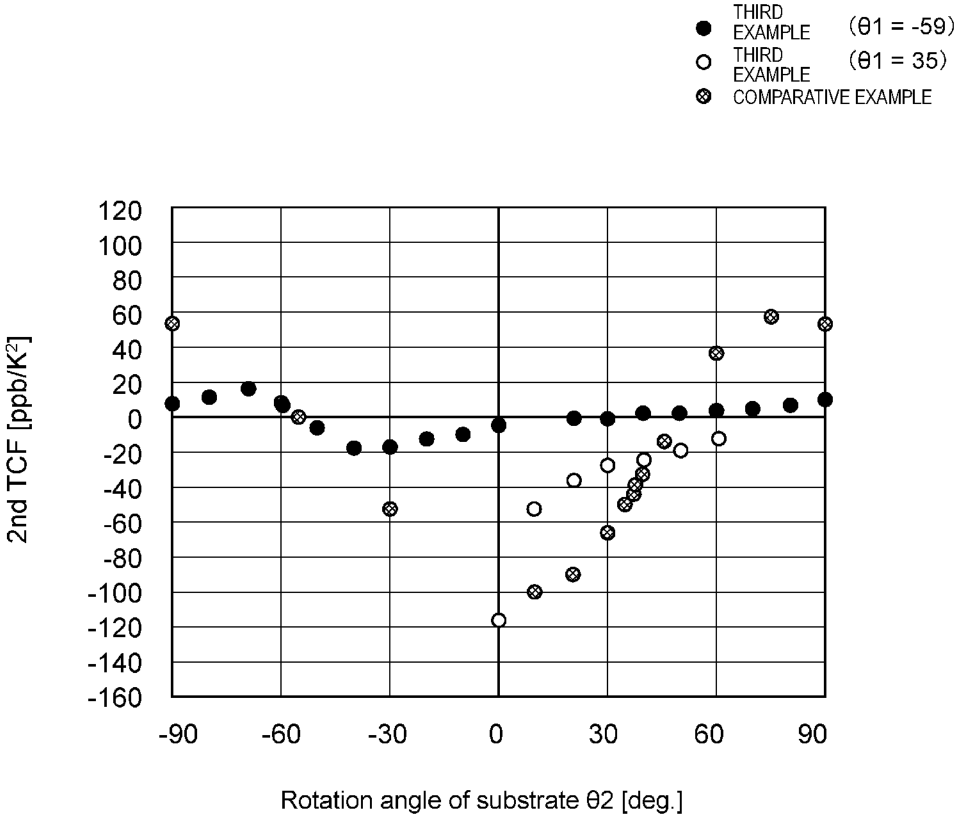
FIG. 21 is a graph showing a relationship between the rotation angle of the high acoustic velocity substrate in the third example and the second-order temperature coefficient of frequency.
Figure 22:
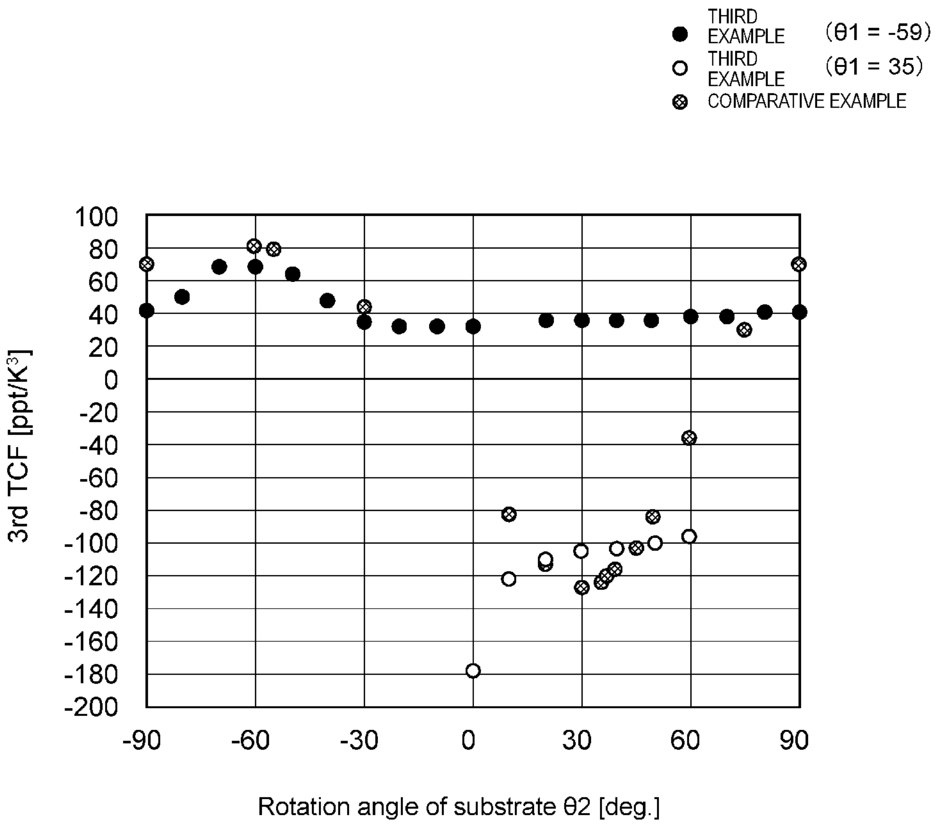
FIG. 22 is a graph showing a relationship between the rotation angle of the high acoustic velocity substrate in the third example and the third-order temperature coefficient of frequency.

Next, with reference to FIGS. 17 to 22, temperature characteristics in an example of the present embodiment will be described. Resonance characteristics and temperature characteristics in a third example were simulated. FIG. 17 is a graph showing a relationship between a rotation angle of a high acoustic velocity substrate in the third example and the acoustic velocity. FIG. 18 is a graph showing a relationship between the rotation angle of the high acoustic velocity substrate in the third example and the electromechanical coupling coefficient. FIG. 19 is a graph showing a relationship between the rotation angle of the high acoustic velocity substrate in the third example and the Q factor. FIG. 20 is a graph showing a relationship between the rotation angle of the high acoustic velocity substrate in the third example and the first-order temperature coefficient of frequency. FIG. 21 is a graph showing a relationship between the rotation angle of the high acoustic velocity substrate in the third example and the second-order temperature coefficient of frequency. FIG. 22 is a graph showing a relationship between the rotation angle of the high acoustic velocity substrate in the third example and the third-order temperature coefficient of frequency.

The third example is different from the second example in that the high acoustic velocity substrate 1 is made of quartz crystal. It is noted that other configurations in the third example are the same as those in the second example. The high acoustic velocity substrate 1 is a quartz crystal in which a plane orthogonal to a crystal Y-axis is rotated around a crystal X-axis at a rotation angle θ2, and the piezoelectric layer 5 and the high acoustic velocity substrate 1 are stacked on each other so that their crystal X axes are parallel to each other. The cut-angles of the quartz crystal of the high acoustic velocity substrate 1 are expressed as (0°, θ2±90°, 90°) in the Euler angles. In the third example, change in resonance characteristics or temperature characteristics was simulated when the rotation angle θ1 of the quartz crystal of the piezoelectric layer 5 is −59° or 35° and the rotation angle θ2 of the quartz crystal of the high acoustic velocity substrate 1 is changed. A comparative example is a resonator using, as a piezoelectric layer, a single-layered high acoustic velocity substrate being made from a quartz crystal represented by the Euler angles (0°, 02±90°, 90°). Thus, the rotation angle θ2 in the comparative example corresponds to the rotation angle θ1 in the third example. In the comparative example, changes in resonance characteristics or temperature characteristics were simulated by changing the rotation angle θ2.

In the graph in FIG. 17, a horizontal axis represents the rotation angle of the high acoustic velocity substrate (Rotation angle of substrate) θ2, and a vertical axis represents the SAW velocity (Phase velocity) (unit: m/s). The SAW velocity in the comparative example at θ2=−59° was 3300 m/s or less, whereas the SAW velocity in the third example (θ1=−59°) increased to 3400 m/s or more in a range of −30°≤θ2≤90°.

In the graph in FIG. 18, a horizontal axis represents the rotation angle of the high acoustic velocity substrate (Rotation angle of substrate) 02, and a vertical axis represents the electromechanical coupling coefficient (Coupling coefficient) (unit: %). The electromechanical coupling coefficient in the comparative example at θ2=−59° was about 4.0%, whereas the electromechanical coupling coefficient in the third example (θ1=−59°) increased to 4.5% or more in a range of −30°≤θ2≤90°, and particularly increased to 5.0% or more in a range of −20°≤θ2≤80°.

In the graph in FIG. 19, a horizontal axis represents the rotation angle of the high acoustic velocity substrate (Rotation angle of substrate) 02, and a vertical axis represents the Q factor (Q). The Q factor in the comparative example at θ2=−59° was 1000 or less, whereas the Q factor in the third example (θ1=−59°) increased to 2000 or more in a range of −30°≤θ2≤90°. In particular, in a range of 0°≤θ2≤60°, an increase in the Q factor was large, and the Q factor in the third example (θ1=−59°) increased to 8500 or more.

Notably, the Q factor in the comparative example at θ2=35° was 8000 or less, whereas the Q factor in the third example (θ1=35°) increased to about 8500 in a range of 20°≤θ2≤40°. That is, even at θ2=35°, at least the Q factor is improved.

In the graph in FIG. 20, a horizontal axis represents the rotation angle of the high acoustic velocity substrate (Rotation angle of substrate) 02, and a vertical axis represents the first-order temperature coefficient of frequency (1st TCF). In the graph in FIG. 21, a horizontal axis represents the rotation angle of the high acoustic velocity substrate (Rotation angle of substrate) 02, and a vertical axis represents the second-order temperature coefficient of frequency (2nd TCF). In the graph in FIG. 22, a horizontal axis represents the rotation angle of the high acoustic velocity substrate (Rotation angle of substrate) 02, and a vertical axis represents the third-order temperature coefficient of frequency (3rd TCF).

The third-order temperature coefficient of frequency in the comparative example at θ2=−59° was about ppt/$K^3$, whereas an absolute value of the third-order temperature coefficient of frequency in the third example (θ1=−59°) was reduced over an entire range of the rotation angle θ2, and was particularly reduced to 40 ppt/$K^3$ or less in a range of −40°≤θ2≤80°. The second-order temperature coefficient of frequency in the comparative example at θ2=° was about −50 ppb/$K^2$, whereas an absolute value of the second-order temperature coefficient of frequency in the third example (θ1=35°) was reduced to 40 ppb/K 2 or less in a range of 20°≤θ2≤60°, and was particularly reduced to about 10 ppb/$K^2$ at θ2=60°. The third-order temperature coefficient of frequency in the comparative example at θ2=° was about −130 ppt/$K^3$, whereas an absolute value of the third-order temperature coefficient of frequency in the third example (θ1=35°) was reduced to 120 ppt/$K^3$ or less in a range of 20°≤θ2≤60°, and was particularly reduced to about 100 ppt/$K^3$ at θ2=60°.

In general, it is noted that an exemplary embodiment of the present invention has been described above. According to an exemplary aspect, a resonator is provided that includes a piezoelectric layer having a first and second surfaces that oppose each other, an IDT electrode on the first surface of the piezoelectric layer, and a high acoustic velocity substrate on the second surface of the piezoelectric layer. Moreover, the piezoelectric layer is made from a quartz crystal having cut-angles obtained by rotating a plane orthogonal to a crystal Y-axis about a crystal X-axis, in a propagation direction at 90°±10° to the crystal X-axis of the piezoelectric layer, an acoustic velocity in the high acoustic velocity substrate is higher than an acoustic velocity in the piezoelectric layer, and the IDT electrode includes a comb-shaped electrode including multiple electrode fingers aligned in the propagation direction.

According to this configuration, a resonator is provided having at least the third-order temperature coefficient of frequency and the Q factor superior to those of a resonator including a single piezoelectric layer. Further, by appropriately selecting the rotation angle for rotating the plane orthogonal to the crystal Y-axis of the quartz crystal of the piezoelectric layer about the crystal X-axis, any of the electromechanical coupling coefficient, the SAW velocity, the first-order temperature coefficient of frequency, and the second-order temperature coefficient of frequency can be improved.

According to an exemplary aspect, the piezoelectric layer may be made from a quartz crystal having cut-angles obtained by rotating a plane orthogonal to the crystal Y-axis in a range of −59°±10° counterclockwise when viewed from a positive direction side of the crystal X-axis.

According to this configuration, a resonator is provided having a SAW velocity and electromechanical coupling coefficient further superior to those of the resonator including the single piezoelectric layer.

According to an exemplary aspect, the piezoelectric layer may be made from a quartz crystal having cut-angles obtained by rotating a plane orthogonal to the crystal Y-axis in a range of 35°±10° counterclockwise when viewed from a positive direction side of the crystal X-axis.

According to an exemplary aspect, the piezoelectric layer and the high acoustic velocity substrate may be directly stacked on each other.

According to an exemplary aspect, the resonator may further include a low acoustic velocity layer disposed between the piezoelectric layer and the high acoustic velocity substrate, and in the propagation direction, an acoustic velocity in the low acoustic velocity layer may be equal to or less than the acoustic velocity in the piezoelectric layer.

According to an exemplary aspect, a thickness of the low acoustic velocity layer may be set in a range of 0.1λ to 0.5λ inclusive, where λ is a wavelength of an acoustic wave determined by an electrode period of the IDT electrode.

According to an exemplary aspect, a thickness of the low acoustic velocity layer may be 1/100 or less of a thickness of the high acoustic velocity substrate.

According to an exemplary aspect, a thickness of the piezoelectric layer may be set in a range of 0.05λ to 0.5λ inclusive, where λ is a wavelength of an acoustic wave determined by an electrode period of the IDT electrode.

According to an exemplary aspect, a thickness of the piezoelectric layer may be 1/100 or less of a thickness of the high acoustic velocity substrate.

According to an exemplary aspect, in the propagation direction, the acoustic velocity in the high acoustic velocity substrate may be higher than the acoustic velocity in the piezoelectric layer by 20% or more.

According to an exemplary aspect, in the propagation direction, the acoustic velocity in the high acoustic velocity substrate may be higher than the acoustic velocity in the piezoelectric layer by 40% or more.

According to an exemplary aspect, the high acoustic velocity substrate may be made of any one of silicon, a silicon compound, and an aluminum compound.

According to an exemplary aspect, the high acoustic velocity substrate may be made of a single crystal of silicon.

According to an exemplary aspect, the high acoustic velocity substrate may be made from a quartz crystal having cut-angles obtained by rotating a plane orthogonal to a crystal Y-axis in a range of 0° to 60° inclusive counterclockwise when viewed from a positive direction side of a crystal X-axis, and the crystal X-axis of the piezoelectric layer and the crystal X-axis of the high acoustic velocity substrate may be parallel to each other.

According to an exemplary aspect, the IDT electrode may be made of a metal containing aluminum as a main component.

As described above, according to the exemplary aspect, a resonator is provided having excellent frequency temperature characteristics or resonance characteristics.

In general, it is noted that the exemplary embodiment described above is intended to facilitate understanding of the present invention, and is not intended to limit interpretation of the present invention. The present invention may be modified or improved without departing from the gist thereof, and equivalents thereof are also included in the present invention. That is, design changes made by a person skilled in the art to the embodiment and/or the modifications as appropriate are also included in the scope of the present invention as long as they have the features of the present invention. For example, each element and the arrangement, material, condition, shape, size, and the like thereof included in the embodiment and/or the modifications are not limited to those illustrated and can be changed as appropriate. In addition, the embodiment and the modifications are examples, and it is obvious that partial replacements or combinations of the individual configurations illustrated in the embodiment and/or modifications are possible, and these are also included in the scope of the present invention as long as the features of the present invention are included.

REFERENCE SIGNS LIST

1 HIGH ACOUSTIC VELOCITY SUBSTRATE
3 LOW ACOUSTIC VELOCITY LAYER
5 PIEZOELECTRIC LAYER
7 IDT ELECTRODE
**7*b*** ELECTRODE FINGER
9 REFLECTOR
10 RESONATOR
PD PROPAGATION DIRECTION

The invention claimed is:

1. A resonator comprising:

a piezoelectric layer having first and second surfaces that oppose each other;

an IDT electrode on the first surface of the piezoelectric layer; and a high acoustic velocity substrate on the second surface of the piezoelectric layer, wherein the piezoelectric layer comprises a quartz crystal having cut-angles obtained by rotating a plane orthogonal to a crystal Y-axis about a crystal X-axis, wherein, in a propagation direction at 90°±10° to the crystal X-axis of the piezoelectric layer, an acoustic velocity in the high acoustic velocity substrate is higher than an acoustic velocity in the piezoelectric layer, and wherein the IDT electrode includes a comb-shaped electrode including a plurality of electrode fingers aligned in the propagation direction.

2. The resonator according to claim 1, wherein the piezoelectric layer comprises a quartz crystal having cut-angles obtained by rotating a plane orthogonal to the crystal Y-axis in a range of −59°±10° counterclockwise when viewed from a positive direction side of the crystal X-axis.

3. The resonator according to claim 1, wherein the piezoelectric layer comprises a quartz crystal having cut-angles obtained by rotating a plane orthogonal to the crystal Y-axis in a range of 35°±10° counterclockwise when viewed from a positive direction side of the crystal X-axis.

4. The resonator according to claim 1, wherein the piezoelectric layer and the high acoustic velocity substrate are directly stacked on each other.

5. The resonator according to claim 1, further comprising a low acoustic velocity layer disposed between the piezoelectric layer and the high acoustic velocity substrate.

6. The resonator according to claim 5, wherein, in the propagation direction, an acoustic velocity in the low acoustic velocity layer is equal to or lower than the acoustic velocity in the piezoelectric layer.

7. The resonator according to claim 6, wherein the low acoustic velocity layer has a thickness in a range of 0.1λ to 0.5λ, and where λ is a wavelength of an acoustic wave of an electrode period of the IDT electrode.

8. The resonator according to claim 6, wherein the low acoustic velocity layer has a thickness that is 1/100 or less of a thickness of the high acoustic velocity substrate.

9. The resonator according to claim 1, wherein the piezoelectric layer has a thickness in a range of 0.05λ to 0.5λ, and where λ is a wavelength of an acoustic wave of an electrode period of the IDT electrode.

10. The resonator according to claim 1, wherein the piezoelectric layer has a thickness that is 1/100 or less of a thickness of the high acoustic velocity substrate.

11. The resonator according to claim 1, wherein, in the propagation direction, the acoustic velocity in the high acoustic velocity substrate is higher than the acoustic velocity in the piezoelectric layer by at least 20%.

12. The resonator according to claim 11, wherein, in the propagation direction, the acoustic velocity in the high acoustic velocity substrate is higher than the acoustic velocity in the piezoelectric layer by at least 40%.

13. The resonator according to claim 1, wherein the high acoustic velocity substrate comprises one of silicon, a silicon compound, and an aluminum compound.

14. The resonator according to claim 1, wherein the high acoustic velocity substrate comprises a single crystal of silicon.

15. The resonator according to claim 1, wherein the high acoustic velocity substrate comprises a quartz crystal having cut-angles obtained by rotating a plane orthogonal to a crystal Y-axis in a range between 0° to 60° counterclockwise when viewed from a positive direction side of a crystal X-axis.

16. The resonator according to claim 15, wherein the crystal X-axis of the piezoelectric layer is parallel to the crystal X-axis of the high acoustic velocity substrate.

17. The resonator according to claim 1, wherein the IDT electrode comprises a metal containing aluminum as a main component.

18. A resonator comprising:

a piezoelectric layer having first and second surfaces that oppose each other and comprising a quartz crystal having cut-angles obtained by rotating a plane orthogonal to a crystal Y-axis about a crystal X-axis;

an IDT electrode on the first surface of the piezoelectric layer; and a substrate on the second surface of the piezoelectric layer and having an acoustic velocity, in a propagation direction at 90°±10° to the crystal X-axis of the piezoelectric layer, that is higher than an acoustic velocity in the piezoelectric layer.

19. The resonator according to claim 18, wherein the IDT electrode includes a comb-shaped electrode including a plurality of electrode fingers aligned in the propagation direction.

20. The resonator according to claim 18, further comprising:

a low acoustic velocity layer disposed between the piezoelectric layer and the substrate, wherein, in the propagation direction, an acoustic velocity in the low acoustic velocity layer is equal to or lower than the acoustic velocity in the piezoelectric layer.

* * * * *